(12) United States Patent
Okada et al.

(10) Patent No.: US 10,676,820 B2
(45) Date of Patent: Jun. 9, 2020

(54) CLEANING METHOD AND FILM FORMING METHOD

(71) Applicant: TOKYO ELECTRON LIMITED, Minato-ku, Tokyo (JP)

(72) Inventors: Mitsuhiro Okada, Nirasaki (JP); Yutaka Motoyama, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/186,921

(22) Filed: Nov. 12, 2018

(65) Prior Publication Data

US 2019/0144994 A1 May 16, 2019

(30) Foreign Application Priority Data

Nov. 13, 2017 (JP) ................................. 2017-218558

(51) Int. Cl.
*C23C 16/44* (2006.01)
*C23C 16/458* (2006.01)
*C23C 16/24* (2006.01)
*C23C 16/28* (2006.01)

(52) U.S. Cl.
CPC .......... *C23C 16/4405* (2013.01); *C23C 16/24* (2013.01); *C23C 16/28* (2013.01); *C23C 16/4404* (2013.01); *C23C 16/4583* (2013.01)

(58) Field of Classification Search
None
See application file for complete search history.

(56) References Cited

U.S. PATENT DOCUMENTS 6,042,654 A * 3/2000 Comita ............... C23C 16/4405
134/2
2003/0221708 A1* 12/2003 Ly ............................ B08B 7/00
134/18

FOREIGN PATENT DOCUMENTS

JP       H04-157161 A       5/1992

* cited by examiner

*Primary Examiner* — Asok K Sarkar
(74) *Attorney, Agent, or Firm* — Nath, Goldberg & Meyer; Jerald L. Meyer

(57) ABSTRACT

There is provided a cleaning method of a film forming apparatus in which a process of forming a silicon film, a germanium film or a silicon germanium film on a substrate mounted on a substrate holder in a processing container is performed, comprising: etching away the silicon film, the germanium film or the silicon germanium film adhered to an interior of the processing container including the substrate holder by supplying a halogen-containing gas not containing fluorine into the processing container in a state where the substrate holder, which was stored in a dew point-controlled atmosphere after the film forming process, is accommodated in the processing container with no substrate being mounted thereon.

12 Claims, 2 Drawing Sheets

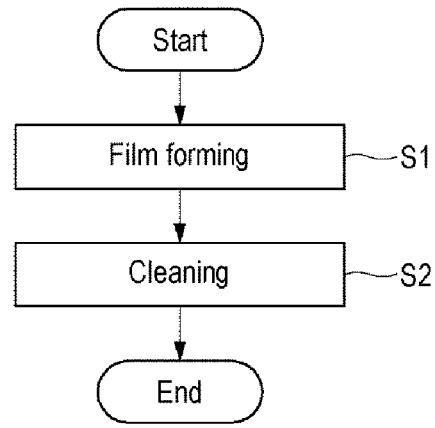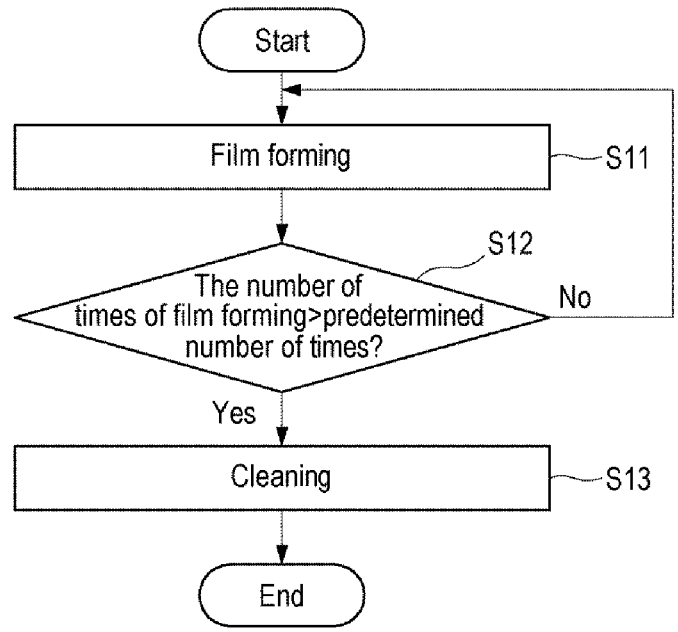

CLEANING METHOD AND FILM FORMING METHOD

CROSS-REFERENCE TO RELATED APPLICATION

This application is based upon and claims the benefit of priority from Japanese Patent Application No. 2017-218558, filed on Nov. 13, 2017, the entire contents of which are incorporated herein by reference.

TECHNICAL FIELD

The present disclosure relates to a cleaning method and a film forming method.

BACKGROUND

A vertical heat treatment apparatus is known in which heat treatment is performed on a plurality of substrates at once by using a wafer boat which is installed in a processing container to be rotated around a predetermined rotary shaft and which holds the plurality of substrates substantially horizontally with a predetermined interval in the vertical direction. In the vertical heat treatment apparatus, when heat treatment is repeatedly performed, reaction products adhere to the inner wall of the processing container and the wafer boat. The adhered reaction products may float as particles and adhere to the substrates, which may cause a reduction in yield.

In order to avoid this problem, there has been proposed a cleaning technique for removing reaction products adhered to the inner wall of a processing container and a wafer boat by supplying a fluorine-containing gas such as a chlorine trifluoride ($ClF_3$) gas or the like into the processing container.

However, in the proposed technique, when a film forming process is performed after the cleaning, fluorine remaining in the processing container may be adsorbed on the surface of an underlying surface and enter a film, which may deteriorate the device characteristics.

SUMMARY

Some embodiments of the present disclosure provide a cleaning method capable of preventing fluorine from being adsorbed on the surface of an underlying surface and entering a film.

According to one embodiment of the present disclosure, there is provided a cleaning method of a film forming apparatus in which a process of forming a silicon film, a germanium film or a silicon germanium film on a substrate mounted on a substrate holder in a processing container is performed, including: etching away the silicon film, the germanium film or the silicon germanium film adhered to an interior of the processing container including the substrate holder by supplying a halogen-containing gas not containing fluorine into the processing container in a state where the substrate holder, which was stored in a dew point-controlled atmosphere after the film forming process, is accommodated in the processing container with no substrate being mounted thereon.

According to one embodiment of the present disclosure, there is provided a method of forming a film, including: forming a silicon film, a germanium film or a silicon germanium film on a substrate mounted on a substrate holder in a processing container; and etching away the silicon film, the germanium film or the silicon germanium film adhered to an interior of the processing container including the substrate holder by supplying a halogen-containing gas not containing fluorine into the processing container in a state where the substrate holder, which was stored in a dew point-controlled atmosphere after the film forming process, is accommodated in the processing container with no substrate being mounted thereon.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a flow chart showing an example of a film forming method according to a first embodiment.

FIG. 3 is a flow chart showing an example of a film forming method according to a second embodiment.

DETAILED DESCRIPTION

Figure 1:
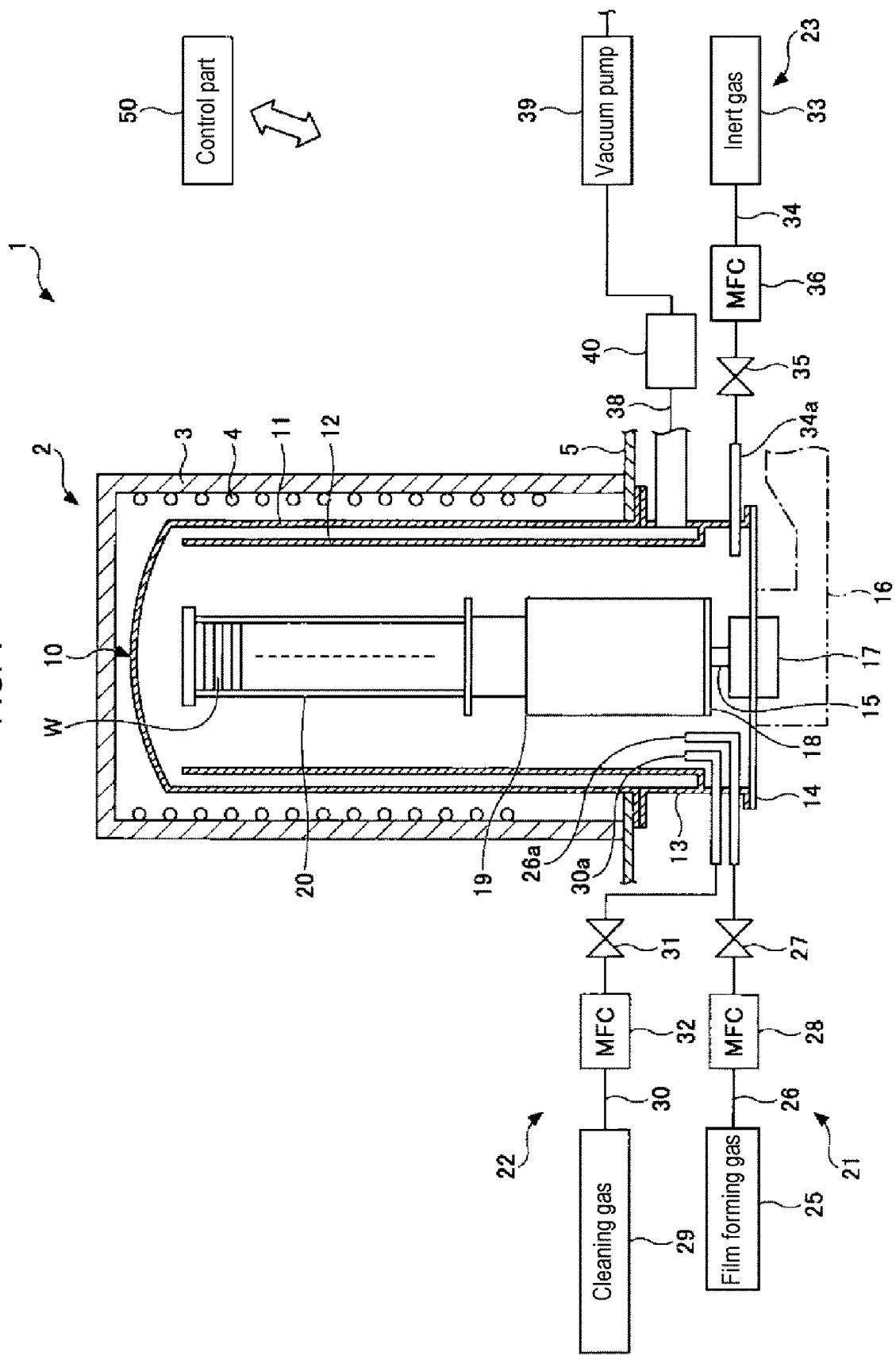
FIG. 1 is a schematic view of an example of a film forming apparatus for carrying out a cleaning method according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, modes for carrying out the present disclosure will be described with reference to the drawings. Throughout the present disclosure and the drawings, substantially the same constituent elements are denoted by the same reference numerals and description of which will not be repeated.

[Film Forming Apparatus]

A film forming apparatus for carrying out a cleaning method according to an embodiment of the present disclosure will be described by way of an example of a batch type vertical heat treatment apparatus which processes a plurality of substrates in batch. However, the cleaning method according to the embodiment of the present disclosure can also be applied to an apparatus different from the vertical heat treatment apparatus, for example, a single wafer type apparatus which processes substrates one by one. FIG. 1 is a schematic view of an example of a film forming apparatus for carrying out a cleaning method according to an embodiment of the present disclosure.

As shown in FIG. 1, the film forming apparatus 1 includes a heating furnace 2. The heating furnace 2 includes a cylindrical heat insulating body 3 having a ceiling portion, and a heater 4 installed on the inner peripheral surface of the heat insulating body 3. The heating furnace 2 is installed on a base plate 5. A processing container 10 is installed in the heating furnace 2.

The processing container 10 has a dual-tube structure including an outer tube 11 with its upper end closed, and an inner tube 12 concentrically arranged in the outer tube 11. The outer tube 11 and the inner tube 12 are made of a heat resistant material such as quartz. The outside of the processing container 10 is surrounded by the heater 4.

The outer tube 11 and the inner tube 12 are each held at their lower ends thereof by a cylindrical manifold 13 made of stainless steel or the like. At the lower end opening of the manifold 13 is installed an openable/closable cap 14 for hermetically sealing the opening.

A rotary shaft 15 rotatable in an airtight state, for example, by a magnetic seal is inserted in the central portion of the cap 14, the lower end of the rotary shaft 15 is connected to a rotating mechanism 17 of an elevating table 16, and the upper end thereof is fixed to a turntable 18. A wafer boat 20, which is a substrate holder for holding a semiconductor wafer (hereinafter referred to as a "wafer W") as a substrate, is placed on the turntable 18 via a heat insulating barrel 19. The wafer boat 20 is made of a heat resistant material such as silicon carbide (SiC) or quartz. The wafer boat 20 holds a plurality of wafers W, for example, 50 to 150 wafers W, substantially horizontally at predetermined intervals in the vertical direction.

The wafer boat 20 can be loaded/unloaded into/from the processing container 10 when the elevating table 16 is moved up/down by an elevating mechanism (not shown). When the wafer boat 20 is loaded into the processing container 10, the cap 14 is brought into close contact with the manifold 13, while hermetically sealing a space therebetween.

The film forming apparatus 1 includes a film forming gas supply mechanism 21, a cleaning gas supply mechanism 22 and an inert gas supply mechanism 23.

The film forming gas supply mechanism 21 introduces a film forming gas into the processing container 10. The film forming gas supply mechanism 21 includes a film forming gas supply source 25, a film forming gas pipe 26 and a film forming gas nozzle 26a. The film forming gas pipe 26 guides the film forming gas from the film forming gas supply source 25. An opening/closing valve 27 and a flow rate controller 28 such as a mass flow controller are disposed on the film forming gas pipe 26 so as to supply the film forming gas while controlling the flow rate of the film forming gas. The film forming gas nozzle 26a is made of quartz, is connected to the film forming gas pipe 26, and is installed to penetrate through the lower portion of the side wall of the manifold 13. When a silicon film such as an amorphous silicon film or a polysilicon film is formed, a silane-based gas such as a monosilane ($SiH_4$) gas, a disilane ($Si_2H_6$) gas or the like may be used as the film forming gas. When a germanium film is formed, a germane-based gas such as a monogermane ($GeH_4$) gas, a digermane ($Ge_2H_6$) gas or the like may be used. When a silicon germanium film is formed, a silane-based gas and a germane-based gas may be used.

The cleaning gas supply mechanism 22 introduces a cleaning gas into the processing container 10. The cleaning gas supply mechanism 22 includes a cleaning gas supply source 29, a cleaning gas pipe 30 and a cleaning gas nozzle 30a. The cleaning gas pipe 30 guides the cleaning gas from the cleaning gas supply source 29. An opening/closing valve 31 and a flow rate controller 32 such as a mass flow controller are disposed on the cleaning gas pipe 30 so as to supply the cleaning gas while controlling the flow rate of the cleaning gas. The cleaning gas nozzle 30a is connected to the cleaning gas pipe 30 and is installed to penetrate through the lower portion of the side wall of the manifold 13. Examples of the cleaning gas may include halogen-containing gases that do not contain fluorine (F), such as a chlorine ($Cl_2$) gas, a hydrogen chloride (HCl) gas, a bromine ($Br_2$) gas, a hydrogen bromide (HBr) gas, a hydrogen iodide (HI) gas and the like.

The inert gas supply mechanism 23 introduces an inert gas used as a purge gas or the like into the processing container 10. The inert gas supply mechanism 23 includes an inert gas supply source 33, an inert gas pipe 34 and an inert gas nozzle 34a. The inert gas pipe 34 guides the inert gas from the inert gas supply source 33. An opening/closing valve 35 and a flow rate controller 36 such as a mass flow controller are disposed on the inert gas pipe 34 so as to supply the inert gas while controlling the flow rate of the inert gas. The inert gas nozzle 34a is connected to the inert gas pipe 34 and is installed to penetrate the lower portion of the side wall of the manifold 13. Examples of the inert gas may include a rare gas such as an Ar gas or the like, a $N_2$ gas and the like.

An exhaust pipe 38 for discharging a processing gas from a gap between the outer tube 11 and the inner tube 12 is connected to the upper portion of the side wall of the manifold 13. The exhaust pipe 38 is connected to a vacuum pump 39 for exhausting the interior of the processing container 10. A pressure regulating mechanism 40 including a pressure regulating valve and the like is disposed on the exhaust pipe 38. Thus, it is possible to adjust the interior of the processing container 10 to a predetermined pressure by means of the pressure regulating mechanism 40 while exhausting the interior of the processing container 10 by means of the vacuum pump 39.

The film forming apparatus 1 includes a control part 50. The control part 50 is, for example, a computer and includes a CPU, a user interface and a storage part. The CPU controls various components of the film forming apparatus 1, for example, valves, mass flow controllers, a heater power supply, drive mechanisms such as the elevating mechanism, and so on. The user interface includes a keyboard for allowing an operator to perform an input operation of a command and the like to manage the film forming apparatus 1, a display for visualizing and displaying the operation situations of the film forming apparatus 1, and the like. The storage part stores parameters of various processes to be executed in the film forming apparatus 1, and programs for causing various components of the film forming apparatus 1 to execute the processes according to processing conditions, that is, processing recipes, etc. The control part 50 calls an arbitrary processing recipe from the storage part in accordance with an instruction from the user interface or the like, and causes the computer to execute the called processing recipe. Thus, a predetermined process in the film forming apparatus 1 is performed under control of the CPU.

[Film Forming Method]
(First Embodiment)

Next, an example of a film forming method including a cleaning method according to a first embodiment will be described. FIG. 2 is a flow chart showing an example of a film forming method according to the first embodiment. The film forming method according to the first embodiment is repeatedly executed by the control part 50 controlling each component of the film forming apparatus 1.

Hereinafter, a case where a polysilicon film is formed by using a $SiH_4$ gas as a precursor gas and a polysilicon film adhered to the inner wall of the processing container 10 and the wafer boat 20 is removed by using a $Cl_2$ gas as a cleaning gas will be described by way of an example.

As shown in FIG. 2, the film forming method according to the embodiment of the present disclosure includes a film forming step S1 and a cleaning step S2.

The film forming step S1 is a step of forming a silicon film, a germanium film or a silicon germanium film on each of the wafers W mounted on the wafer boat 20 in the processing container 10. In the present embodiment, first, wafers W are transported to and mounted on the wafer boat 20, which is stored outside the processing container 10, from a transport container (not shown) such as a FOUP (Front-Opening Unified Pod) or the like by means of a transport device (not shown). Subsequently, the wafer boat 20 with the wafers W mounted thereon is placed on the turntable 18 via the heat insulating barrel 19, and the elevating table 16 is raised to load the wafer boat 20 from the lower end opening of the manifold 13 into the processing container 10. Subsequently, after the interior of the processing container 10 is adjusted to a predetermined pressure, a predetermined flow rate of $SiH_4$ gas is supplied as a film forming gas from the film forming gas supply source 25 into the processing container 10 through the film forming gas pipe 26, and a polysilicon film is formed at a predetermined temperature (for example, 620 degrees C.) while rotating the wafer boat 20. The wafer boat 20 may be made of SiC when the wafers W are silicon wafers. This is because, due to a small difference in thermal expansion coefficient between SiC and Si, the wafer boat 20 and the wafers W expand almost in unison when raising the temperature of the wafer boat 20 having the wafers mounted thereon, thereby providing a small friction therebetween while suppressing generation of particles. After completion of the film formation, the supply of the $SiH_4$ gas as the film forming gas is stopped, the interior of the processing container 10 is exhausted via the exhaust pipe 38 by means of the vacuum pump 39, and the inert gas is supplied from the inert gas supply source 33 into the processing container 10 via the inert gas pipe 34 so as to purge the interior of the processing container 10. Subsequently, after returning the interior of the processing container 10 to the normal pressure, the elevating table 16 is lowered to unload the wafer boat 20 to a region in a dew point-controlled atmosphere. The dew point-controlled atmosphere refers to an inert gas atmosphere, a dry air atmosphere or a vacuum atmosphere. The wafers W mounted on the unloaded wafer boat 20 are cooled in the region in the dew point-controlled atmosphere and are then collected from the wafer boat 20 into the FOUP (Front-Opening Unified Pod) or the like by means of the transport device (not shown). In this manner, the wafer boat 20 is unloaded from the processing container 10 and is then stored in the region in the dew point-controlled atmosphere.

The cleaning step S2 is a step of etching away a silicon film, a germanium film or a silicon germanium film adhered to the wafer boat 20 by supplying a halogen-containing gas not containing fluorine into the processing container 10 in a state where the wafer boat 20, which was stored in the dew point-controlled atmosphere after the film forming step S1 and has no wafer W mounted thereon, is accommodated in the processing container 10. In the present embodiment, the wafer boat 20, which was stored in the dew point-controlled atmosphere after the film forming step S1 and has no wafer W mounted thereon, is placed on the turntable 18 via the heat insulating barrel 19, and is then loaded from the lower end opening of the manifold 13 into the processing container 10 when the elevating table 16 is raised. Subsequently, the interior of the processing container 10 is adjusted to a predetermined pressure, the wall surface of the processing container 10 is adjusted to a predetermined temperature, and then a predetermined flow rate of $Cl_2$ gas as the cleaning gas is supplied from the cleaning gas supply source 29 into the processing container 10 via the cleaning gas pipe 30 in order to etch away the polysilicon film adhered to the inner wall of the processing container 10 and the wafer boat 20 in the film forming step S1. The predetermined temperature is preferably 300 degrees C. or more, more preferably 400 degrees C. or more, from the viewpoint of securing a high etching rate and shortening the time required for the cleaning step S2. In addition, the predetermined temperature is preferably less than 700 degrees C., more preferably 600 degrees C. or less, from the viewpoint of preventing the inner wall of the processing container 10 and the wafer boat 20 from being etched and damaged. Further, together with the cleaning gas, the inert gas may be supplied from the inert gas supply source 33 into the processing container 10 via the inert gas pipe 34.

By the way, the $Cl_2$ gas is a gas having a high etching selectivity of the polysilicon film to $SiO_2$ and SiC. Further, in the present embodiment, since the wafer boat 20 is stored in the dew point-controlled atmosphere during a period from the end of the film forming step S1 to the start of the cleaning step S2, no natural oxide film is formed on the surface of the polysilicon film. Thus, in the cleaning step S2, the polysilicon film adhered to the inner wall of the processing container 10 and the wafer boat 20 exposed to the $Cl_2$ gas is selectively etched away. On the other hand, since the processing container 10 is made of a heat resistant material such as quartz ($SiO_2$) and the wafer boat 20 is made of a heat resistant material such as quartz ($SiO_2$) or SiC, they are hardly etched by the $Cl_2$ gas. Therefore, it is possible to remove the polysilicon film adhered to the inner wall of the processing container 10 and the wafer boat 20 without damaging the processing container 10 and the wafer boat 20.

After completion of the cleaning, the supply of the $Cl_2$ gas as the cleaning gas is stopped, the interior of the processing container 10 is exhausted via the exhaust pipe 38 by means of the vacuum pump 39, and then inert gas is supplied from the inert gas supply source 33 into the processing container 10 via the inert gas pipe 34 so as to purge the interior of the processing container 10. Subsequently, after returning the interior of the processing container 10 to the normal pressure, the elevating table 16 is lowered to unload the wafer boat 20 to the region in the dew point-controlled atmosphere.

As described above, in the first embodiment, in the cleaning step S2, a polysilicon film adhered to the interior of the processing container 10 including the wafer boat 20 is etched away by supplying a halogen-containing gas not containing fluorine into the processing container 10 in a state where the wafer boat 20, which was stored in the dew point-controlled atmosphere after film formation and has no wafer W mounted thereon, is accommodated in the processing container 10. Thus, no fluorine (F) is introduced into the processing container 10 in the cleaning step S2. Therefore, it is possible to prevent fluorine (F) from being adsorbed onto an underlying surface and fluorine (F) from entering a film.

In addition, in the first embodiment, the cleaning is performed using a $Cl_2$ gas having a high etching selectivity of the polysilicon film to $SiO_2$ and SiC which are materials of the processing container 10 and the wafer boat 20. Thus, the processing container 10 and the wafer boat 20 are hardly damaged.

In addition, in the first embodiment, the cleaning step S2 is executed whenever the film forming step S1 is performed. In other words, the film forming step S1 and the cleaning step S2 are alternately repeated. Thus, the polysilicon film is removed by the cleaning step S2 before the polysilicon film adhered to the inner wall of the processing container 10 and the wafer boat 20 becomes thicker in the film forming step S1. Therefore, it is possible to prevent the polysilicon film adhered to the inner wall of the processing container 10 and the wafer boat 20 from being peeled off, floating as particles and adhering to the wafers W in the processing container 10. Further, since the state in the processing container 10 at the time of performing the film forming step S1 is substantially uniform, the process stability is improved.

Further, a case where a polysilicon film is formed in the film forming step S1 has been illustrated in the above embodiment, but the present disclosure is not limited thereto. For example, the film formed in the film forming step S1 may be a different silicon film such as an amorphous silicon film, or may be a germanium film or a silicon germanium film. The silicon film, the germanium film and the silicon germanium film may be non-doped films or films doped with carbon (C), phosphorus (P), boron (B) or the like.

Furthermore, a case where a $Cl_2$ gas is used as the cleaning gas in the cleaning step S2 has been illustrated in the above embodiment, but the present disclosure is not limited thereto. The cleaning gas may be a halogen gas not containing fluorine, for example, a HCl gas, a $Br_2$ gas, a HBr gas or a HI gas.

(Second Embodiment)

Next, an example of a film forming method including a cleaning method according to a second embodiment will be described. FIG. 3 is a flow chart showing an example of a film forming method according to a second embodiment. The film forming method according to the second embodiment is repeatedly executed by the control part 50 controlling each component of the film forming apparatus 1.

Hereinafter, a case where a polysilicon film is formed by using a $SiH_4$ gas as a precursor gas and a polysilicon film adhered to the inner wall of the processing container 10 and the wafer boat 20 is removed by using a $Cl_2$ gas as a cleaning gas will be described by way of an example.

As shown in FIG. 3, in the film forming method according to the second embodiment, a film forming step S11 is repeatedly executed plural times exceeding a predetermined number of times, and then a cleaning step S13 is executed. The predetermined number of times may be the number of times by which a film adhered to the inner wall of the processing container 10 and the wafer boat 20 in the film forming step S11 does not reach a thickness of film to be peeled off, and is determined depending on the type of film to be formed in the film forming step S11. The film forming step S11 may be the same as the film forming step S1 of the first embodiment. The cleaning step S13 may be the same as the cleaning step S2 of the first embodiment. Further, after removing the films adhered to the processing container 10 and the wafer boat 20 in the cleaning step S13, in a state where the wafer boat 20 is accommodated in the processing container 10, the same film as a film to be formed in the next film forming step S1 may be formed.

As described above, in the second embodiment, in the cleaning step S13, a polysilicon film adhered to the interior of the processing container 10 including the wafer boat 20 is etched away by supplying a halogen-containing gas not containing fluorine into the processing container 10 in a state where the wafer boat 20, which was stored in the dew point-controlled atmosphere after film formation and has no wafer W mounted thereon, is accommodated in the processing container 10. Thus, no fluorine (F) is introduced into the processing container 10 in the cleaning step S13. Therefore, it is possible to prevent fluorine (F) from being adsorbed onto an underlying surface and fluorine (F) from entering a film.

In addition, in the second embodiment, the cleaning is performed using a $Cl_2$ gas having a high etching selectivity of the polysilicon film to $SiO_2$ and SiC which are materials of the processing container 10 and the wafer boat 20. Thus, the processing container 10 and the wafer boat 20 are hardly damaged.

In addition, a case where a polysilicon film is formed in the film forming step S11 has been illustrated in the second embodiment, but the present disclosure is not limited thereto. For example, the film formed in the film forming step S11 may be a different silicon film such as an amorphous silicon film, or may be a germanium film or a silicon germanium film. The silicon film, the germanium film and the silicon germanium film may be non-doped films or films doped with carbon (C), phosphorus (P), boron (B) or the like.

Further, a case where a $Cl_2$ gas is used as the cleaning gas in the cleaning step S13 has been illustrated in the second embodiment, but the present disclosure is not limited thereto. The cleaning gas may be a halogen gas not containing fluorine, for example, a HCl gas, a $Br_2$ gas, a HBr gas or a HI gas.

EXAMPLES

Next, the effects of the cleaning method according to the above embodiments of the present disclosure will be described by way of the following examples.

Example 1

In Example 1, etching resistance of SiC to $Cl_2$ gas was evaluated.

First, a SiC chip was prepared, the surface condition of the SiC chip was observed with an optical microscope, and the mass of the SiC chip was measured.

Subsequently, the SiC chip was placed on the wafer boat 20 of the above-described film forming apparatus 1, the wafer boat 20 was accommodated in the processing container 10, and the above-described cleaning step was executed. The processing conditions in the cleaning step are as follows.

<Processing Conditions>
  $Cl_2$ gas flow rate: 2,000 sccm
  $Cl_2$ gas supply time: about 200 minutes
  Wall surface temperature of processing container 10: 550 degrees C.

Subsequently, the surface condition of the SiC chip after the cleaning step was observed with the optical microscope, and the mass of the SiC chip was measured.

As a result of the observation of the surface condition of the SiC chip, no difference was found in the surface condition of the SiC chip before and after the cleaning step. In addition, as a result of the mass measurement of the SiC chip, no difference was found in the mass of the SiC chip before and after the cleaning step. From these results, it is believed that SiC has etching resistance to $Cl_2$ gas at a temperature of 550 degrees C.

Example 2

In Example 2, etching resistance of SiC to $Cl_2$ gas was evaluated at a higher temperature (600 degrees C.) than that in Example 1.

First, a SiC chip was prepared, the surface condition of the SiC chip was observed with an optical microscope, and the mass of the SiC chip was measured.

Subsequently, the SiC chip was placed on the wafer boat 20 of the above-described film forming apparatus 1, the wafer boat 20 was accommodated in the processing container 10, and the above-described cleaning step was executed. The processing conditions in the cleaning step are as follows.

<Processing Conditions>

$Cl_2$ gas flow rate: 2,000 sccm $Cl_2$ gas supply time: about 70 minutes

Wall surface temperature of processing container 10: 600 degrees C.

Subsequently, the surface condition of the SiC chip after the cleaning step was observed with the optical microscope, and the mass of the SiC chip was measured.

As a result of the observation of the surface condition of the SiC chip, no difference was found in the surface condition of the SiC chip before and after the cleaning step. In addition, as a result of the mass measurement of the SiC chip, no difference was found in the mass of the SiC chip before and after the cleaning step. From these results, it is believed that SiC has etching resistance to $Cl_2$ gas at a temperature of 600 degrees C.

Example 3

In Example 3, it was evaluated whether or not a polysilicon film adhered to the wafer boat 20 was removed by the cleaning using a $Cl_2$ gas.

First, a cleaning step was performed by using a $Cl_2$ gas in a state where the wafer boat 20 having no wafer W and a polysilicon film of a thickness of 100 nm adhered thereto was accommodated in the processing container 10. The processing conditions in the cleaning step are as follows.

<Processing Conditions>

$Cl_2$ gas flow rate: 2,000 sccm $Cl_2$ gas supply time: 5 minutes

Wall surface temperature of processing container 10: 600 degrees C.

Subsequently, it was confirmed by naked eyes whether or not the polysilicon film adhered to the wafer boat 20 was removed.

As a result of carrying out the cleaning step using the $Cl_1$ gas under the above processing conditions, it was confirmed that the polysilicon film adhered to the wafer boat 20 before the cleaning step was removed. From this result, it is believed that the polysilicon film adhered to the wafer boat 20 can be removed by the cleaning using the $Cl_1$ gas.

Example 4

In Example 4, the presence or absence of damage to the wafer boat 20 in a cleaning step was evaluated.

First, a cleaning step was performed by using a $Cl_2$ gas in a state where the wafer boat 20 having no wafer W and a polysilicon film of a thickness of 1.5 µm adhered thereto was accommodated in the processing container 10. The processing conditions in the cleaning step are as follows.

<Processing Conditions>

$Cl_2$ gas flow rate: 2,000 sccm $Cl_1$ gas supply time: about 70 minutes

Wall surface temperature of processing container 10: 600 degrees C.

Wafer boat 20: made of SiC

Subsequently, it was confirmed by an optical microscope whether or not the wafer boat 20 was damaged.

As a result of carrying out the cleaning step using the $Cl_2$ gas under the above processing conditions, the polysilicon film adhered to the wafer boat 20 before the cleaning step was removed. In addition, as a result of observation with the optical microscope, no change was observed in the shape of the wafer boat 20. From these results, it is believed that the cleaning using the $Cl_2$ gas does not cause damage to the SiC wafer boat 20.

Example 5

In Example 5, the presence or absence of influence of a cleaning step on the film thickness of a polysilicon film formed in a film forming step was evaluated.

First, a polysilicon film was formed on a wafer W by the above-described film forming step. Thereafter, a polysilicon film adhered to the processing container 10 and the wafer boat 20 was removed by the above-described cleaning step, and then a polysilicon film was formed on the wafer W by the above-described forming step. In addition, the film thickness of the polysilicon film formed in the film formation step before and after the cleaning step was measured. The processing conditions in the cleaning step are as follows.

<Processing Conditions>

$Cl_2$ gas flow rate: 2,000 sccm $Cl_2$ gas supply time: about 70 minutes

Wall surface temperature of processing container 10: 600 degrees C.

The measurement results of the film thickness of the polysilicon film before and after the cleaning step are shown in Table 1. In Table 1, "TOP", "CTR" and "BTM" represent results of measurement of the film thicknesses of polysilicon films formed on wafers W placed on the top of the wafer boat 20, the center thereof, and the bottom thereof, respectively.

TABLE 1

|  | Before cleaning step | | | After cleaning step | | |
| --- | --- | --- | --- | --- | --- | --- |
|  | TOP | CTR | BTM | TOP | CTR | BTM |
| Average value of film thicknesses(nm) | 208.96 | 199.96 | 204.67 | 208.46 | 199.70 | 204.11 |
| In-plane uniformity(±%) | 0.82 | 1.03 | 1.05 | 0.76 | 1.21 | 1.15 |
| Inter-plane uniformity(±%) | — | 2.20 | — | — | 2.14 | — |

As shown in Table 1, it is confirmed that the average value of the film thicknesses of the polysilicon films and the in-plane uniformity thereof are hardly changed before and after the cleaning step regardless of the vertical position of the wafer boat 20. In addition, it is confirmed that the inter-plane uniformity of the film thicknesses of the polysilicon films are hardly changed before and after the cleaning step. From these facts, it is believed that the cleaning step has little influence on the film thicknesses of the polysilicon films formed in the film forming step.

Although the embodiments of the present disclosure has been illustrated above, the present disclosure is not limited thereto but may be modified and improved in various ways without departing from the scope of the present disclosure.

For example, in the above film forming apparatus 1, a fluorine-containing gas supply source capable of supplying a fluorine-containing gas to the exhaust pipe 38 may be provided without going through the processing container 10. Thus, it is possible to efficiently remove reaction products adhered to the interior of the exhaust pipe 38 without supplying fluorine into the processing container 10.

A case where the substrate is a wafer has been illustrated in the above embodiments, but the present disclosure is not limited thereto. For example, the substrate may be a glass substrate, an LCD substrate or the like.

According to the present disclosure in some embodiments, it is possible to prevent fluorine from entering a film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A cleaning method of a film forming apparatus in which a process of forming a silicon film, a germanium film or a silicon germanium film on a substrate mounted on a substrate holder in a processing container is performed, comprising:
    unloading the substrate holder from the processing container after the process of forming the silicon film, the germanium film or the silicon germanium film on the substrate is performed;
    subsequently, storing the substrate holder in a dew point-controlled atmosphere until the substrate is cooled so that no natural oxide film is formed on the silicon film, the germanium film or the silicon germanium film adhered to the substrate holder;
    subsequently, loading the substrate holder to the processing container with no substrate being mounted on the substrate holder; and
    subsequently, etching away the silicon film, the germanium film or the silicon germanium film adhered to an interior of the processing container and the substrate holder by supplying a halogen-containing gas not containing fluorine into the processing container.

2. The cleaning method of claim 1, wherein the act of etching away is performed whenever the film forming process is performed.

3. The cleaning method of claim 1, wherein the act of etching away is performed after the film forming process is performed plural times.

4. The cleaning method of claim 1, wherein in the act of etching away, a wall surface of the processing container is heated to a temperature of 300 degrees C. or more and less than 700 degrees C.

5. The cleaning method of claim 1, wherein in the act of etching away, a wall surface of the processing container is heated to a temperature of 400 degrees C. or more and 600 degrees C. or less.

6. The cleaning method of claim 1, wherein the substrate holder is made of silicon carbide or quartz.

7. The cleaning method of claim 1, wherein the substrate is plural in number and a plurality of substrates is held on the substrate holder substantially horizontally at a predetermined interval in a vertical direction.

8. The cleaning method of claim 1, wherein the halogen-containing gas is selected from the group consisting of a $Cl_2$ gas, a HCl gas, a $Br_2$ gas, a HBr gas and a HI gas.

9. The cleaning method of claim 1, wherein the dew point-controlled atmosphere is an inert gas atmosphere, a dry air atmosphere or a vacuum atmosphere.

10. A method of forming a film, comprising:
    forming a silicon film, a germanium film or a silicon germanium film on a substrate mounted on a substrate holder in a processing container;
    unloading the substrate holder from the processing container after the process of forming the silicon film, the germanium film or the silicon germanium film on the substrate is performed;
    subsequently, storing the substrate holder in a dew point-controlled atmosphere until the substrate is cooled so that no natural oxide film is formed on the silicon film, the germanium film or the silicon germanium film adhered to the substrate holder;
    subsequently, loading the substrate holder to the processing container with no substrate being mounted on the substrate holder; and
    subsequently, etching away the silicon film, the germanium film or the silicon germanium film adhered to an interior of the processing container and the substrate holder by supplying a halogen-containing gas not containing fluorine into the processing container.

11. The method of claim 10, wherein the act of forming and the act of etching away are alternately repeated.

12. The method of claim 10, wherein the act of etching away is performed after the act of forming is performed plural times.

* * * * *